(12) United States Patent
Cok et al.

(10) Patent No.: US 6,770,502 B2
(45) Date of Patent: Aug. 3, 2004

(54) METHOD OF MANUFACTURING A TOP-EMITTING OLED DISPLAY DEVICE WITH DESICCANT STRUCTURES

(75) Inventors: Ronald S. Cok, Rochester, NY (US); Michael L. Boroson, Rochester, NY (US); Terrence R. O'Toole, Webster, NY (US)

(73) Assignee: Eastman Kodak Company, Rochester, NY (US)

(*) Notice: Subject to any disclaimer, the term of this patent is extended or adjusted under 35 U.S.C. 154(b) by 17 days.

(21) Appl. No.: 10/116,307

(22) Filed: Apr. 4, 2002

(65) Prior Publication Data

US 2003/0190763 A1 Oct. 9, 2003

(51) Int. Cl.⁷ .............................................. H01L 21/00
(52) U.S. Cl. ..................................................... 438/40
(58) Field of Search .............................. 438/40, 41–45, 438/23–28, 34, 800

(56) References Cited

U.S. PATENT DOCUMENTS

| | | | | |
|---|---|---|---|---|
| 3,180,730 A | * | 4/1965 | Klupfel et al. ............... 430/74 |
| 3,567,450 A | * | 3/1971 | Brantley et al. ............. 430/73 |
| 3,658,520 A | * | 4/1972 | Brantly et al. .............. 430/73 |
| 4,081,397 A | * | 3/1978 | Booe ......................... 252/194 |
| 4,356,429 A | * | 10/1982 | Tang ......................... 313/503 |
| 4,539,507 A | * | 9/1985 | VanSlyke et al. .......... 313/504 |
| 4,720,432 A | * | 1/1988 | VanSlyke et al. .......... 428/457 |
| 4,768,292 A | * | 9/1988 | Manzei ........................ 34/70 |
| 4,885,211 A | * | 12/1989 | Tang et al. ................. 428/457 |
| 5,059,861 A | * | 10/1991 | Littman et al. ............ 313/503 |
| 5,059,862 A | * | 10/1991 | VanSlyke et al. .......... 313/503 |
| 5,061,569 A | * | 10/1991 | VanSlyke et al. .......... 428/457 |
| 5,141,671 A | * | 8/1992 | Bryan et al. ........... 252/301.16 |
| 5,150,006 A | * | 9/1992 | Van Slyke et al. ......... 313/504 |
| 5,151,629 A | * | 9/1992 | VanSlyke ................... 313/504 |
| 5,247,190 A | * | 9/1993 | Friend et al. ................ 257/40 |
| 5,276,380 A | * | 1/1994 | Tang ......................... 313/504 |
| 5,294,870 A | * | 3/1994 | Tang et al. ................. 313/504 |
| 5,405,709 A | * | 4/1995 | Littman et al. ............ 428/690 |
| 5,484,922 A | * | 1/1996 | Moore et al. ................. 546/7 |
| 5,593,788 A | * | 1/1997 | Shi et al. ................... 428/690 |
| 5,608,287 A | * | 3/1997 | Hung et al. ................ 313/503 |
| 5,645,948 A | * | 7/1997 | Shi et al. ................... 428/690 |
| 5,677,572 A | * | 10/1997 | Hung et al. ................ 257/750 |
| 5,683,823 A | * | 11/1997 | Shi et al. ................... 428/690 |
| 5,703,436 A | * | 12/1997 | Forrest et al. ............. 313/506 |
| 5,714,838 A | * | 2/1998 | Haight et al. .............. 313/506 |
| 5,739,545 A | * | 4/1998 | Guha et al. .................. 257/40 |
| 5,755,999 A | * | 5/1998 | Shi et al. ............... 252/301.16 |
| 5,776,622 A | * | 7/1998 | Hung et al. ................ 428/690 |
| 5,776,623 A | * | 7/1998 | Hung et al. ................ 428/690 |
| 5,837,391 A | * | 11/1998 | Utsugi ....................... 428/690 |
| 5,851,709 A | * | 12/1998 | Grande et al. ................ 430/7 |
| 5,928,802 A | * | 7/1999 | Shi et al. ................... 428/690 |
| 5,935,720 A | * | 8/1999 | Chen et al. ................ 428/690 |
| 5,935,721 A | * | 8/1999 | Shi et al. ................... 428/690 |

(List continued on next page.)

FOREIGN PATENT DOCUMENTS

| | | |
|---|---|---|
| JP | 11 054285 | 2/1999 |
| JP | 11-162634 | 6/1999 |
| JP | 2000 030871 | 1/2000 |
| JP | 2001 126862 | 5/2001 |
| JP | 2001-126864 | 5/2001 |
| WO | WO 00/36665 | 6/2000 |

Primary Examiner—Craig A. Thompson
(74) Attorney, Agent, or Firm—Thomas H. Close; Andrew J. Anderson

(57) ABSTRACT

This invention provides a top-emitting OLED display device that includes a substrate; an array of OLED elements disposed on one side of the substrate; and a desiccant material provided in a patterned arrangement over the array of OLED elements on the same side of the substrate such that the desiccant material does not interfere with the light emitted by the OLED elements.

6 Claims, 9 Drawing Sheets

U.S. PATENT DOCUMENTS

| | | | | |
|---|---|---|---|---|
| 5,969,474 A | * | 10/1999 | Arai | 313/504 |
| 5,981,306 A | * | 11/1999 | Burrows et al. | 438/22 |
| 6,020,078 A | * | 2/2000 | Chen et al. | 428/690 |
| 6,066,357 A | * | 5/2000 | Tang et al. | 427/66 |
| 6,069,443 A | * | 5/2000 | Jones et al. | 313/504 |
| 6,137,223 A | * | 10/2000 | Hung et al. | 313/506 |
| 6,140,763 A | * | 10/2000 | Hung et al. | 313/503 |
| 6,172,459 B1 | * | 1/2001 | Hung et al. | 313/506 |
| 6,208,075 B1 | * | 3/2001 | Hung et al. | 313/504 |
| 6,226,890 B1 | * | 5/2001 | Boroson et al. | 34/472 |
| 6,237,529 B1 | * | 5/2001 | Spahn | 118/726 |
| 6,268,295 B1 | * | 7/2001 | Ohta et al. | 438/735 |
| 6,278,236 B1 | * | 8/2001 | Madathil et al. | 313/504 |
| 6,300,042 B1 | * | 10/2001 | Mancini et al. | 430/325 |
| 2002/0015907 A1 | * | 2/2002 | Wolk et al. | 430/200 |
| 2002/0024096 A1 | | 2/2002 | Yamazaki et al. | |
| 2003/0038590 A1 | * | 2/2003 | Silvernail et al. | 313/504 |

* cited by examiner

METHOD OF MANUFACTURING A TOP-EMITTING OLED DISPLAY DEVICE WITH DESICCANT STRUCTURES

FIELD OF THE INVENTION

The present invention relates to organic light emitting diode (OLED) displays, and more particularly, to improving the performance, reliability, and robustness of such displays by preventing moisture from degrading the light-emitting OLED materials and improving the contrast of the display.

BACKGROUND OF THE INVENTION

Organic light-emitting diode (OLED) display devices require humidity levels below about 1000 parts per million (ppm) to prevent premature degradation of device performance within a specified operating and/or storage life of the device. Control of the environment to this range of humidity levels within a packaged device is typically achieved by encapsulating the device or by sealing the device and a desiccant within a cover. Desiccants such as, for example, metal oxides, alkaline earth metal oxides, sulfates, metal halides, and perchlorates are used to maintain the humidity level below the above level. See for example U.S. Pat. No. 6,226,890 B1 issued May 8, 2001 to Boroson et al. describing desiccant materials for moisture-sensitive electronic devices. The device disclosed in FIG. 2 of Boroson et al. is a so-called bottom emitting OLED device that emits light through a transparent substrate. The desiccant material is located over the organic light emitting materials in an enclosure that is sealed to the back-side of the substrate.

In a so-called top emitting OLED the organic material is also located on a substrate, but the light is emitted from the surface of the substrate through a transparent cover plate that also serves as part of the sealed enclosure. In this arrangement, desiccant materials located in the enclosure over to the organic materials will interfere with the light emitted by the OLED.

There is a need therefore for an improved means to provide desiccation in a top-emitting OLED display device.

SUMMARY OF THE INVENTION

The need is met by providing a top-emitting OLED display device, that includes a substrate; an array of OLED elements disposed on one side of the substrate; and a desiccant material provided in a patterned arrangement over the array of OLED elements on the same side of the substrate such that the desiccant material does not interfere with the light emitted by the OLED elements.

According to a preferred embodiment of the invention, the patterned arrangement of desiccant material performs the function of a black matrix for increasing the contrast of the display.

ADVANTAGES

The present invention has the advantage that it increases the lifetime of a top-emitting OLED display device by providing desiccation of the OLED elements. In a preferred embodiment, the contrast of the display is also improved.

It will be understood that the figures are not to scale since the individual layers are too thin and the thickness differences of various layers too great to permit depiction to scale.

DETAILED DESCRIPTION OF THE INVENTION

Figure 1:
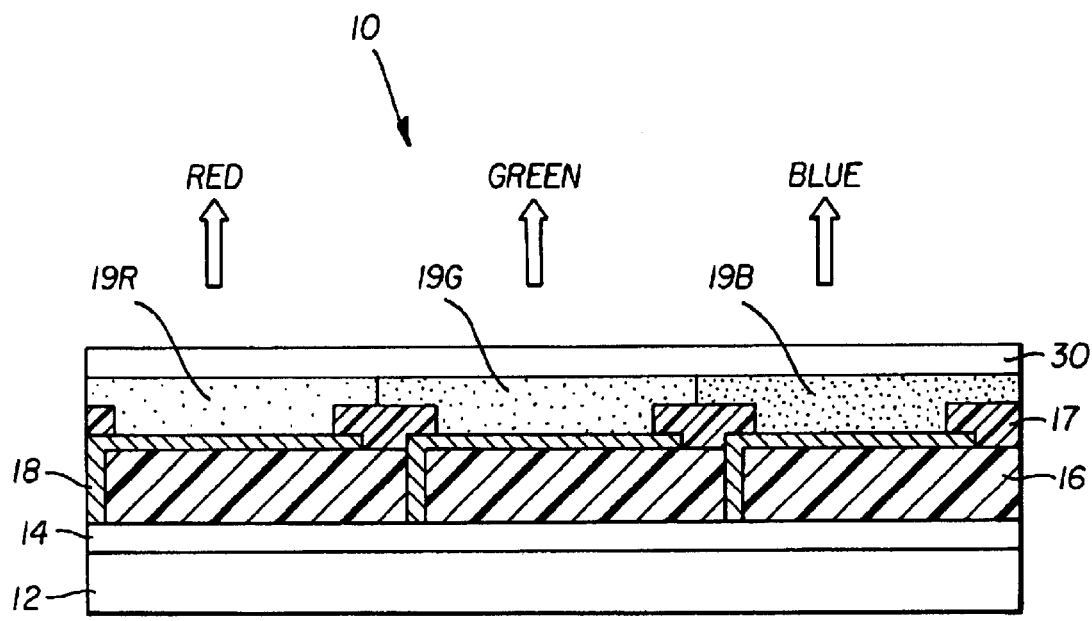
FIG. 1 illustrates a partial cross section of a prior art conventional top-emitting OLED display device.

Referring to FIG. 1, a prior art top-emitting OLED display device 10 is shown with a substrate 12, and a thin-film transistor (TFT) active matrix layer 14 comprising an array of TFTs that provides power to OLED elements. A patterned first insulating layer 16 is provided over the TFT active matrix layer, and an array of first electrodes 18 are provided over insulating layer 16 and in electrical contact with the TFT active matrix layer. A patterned second insulating layer 17 is provided over the array of first electrodes 18 such that at least a portion of the each of the first electrodes 18 is exposed.

Over the first electrodes and insulating layers are provided red, green, and blue-emitting organic electroluminescent (EL) elements, 19R, 19G, and 19B, respectively. Herein, the collection of organic EL elements may also be referred to as the organic EL layer The light-emitting pixel area is generally defined by the area of the first electrode 18 in contact with the organic EL elements. Over the organic EL layer is provided a transparent, common second electrode 30 that has sufficient optical transparency to allow transmission of the generated red, green, and blue light. Each first electrode in combination with its associated organic EL element and second electrode is herein referred to as an OLED element. A typical top-emitting OLED display device comprises an array of OLED elements wherein each OLED element emits red, green or blue. However, monochrome display devices are also known where the array of OLED elements emit the same color light, for example, white.

In operation, the thin-film transistors in TFT layer 14 allow current to flow between the first electrode 18, each of which can be selectively addressed, and the common second electrode 30. Holes and electrons recombine within the organic EL elements to emit light.

Figure 2:
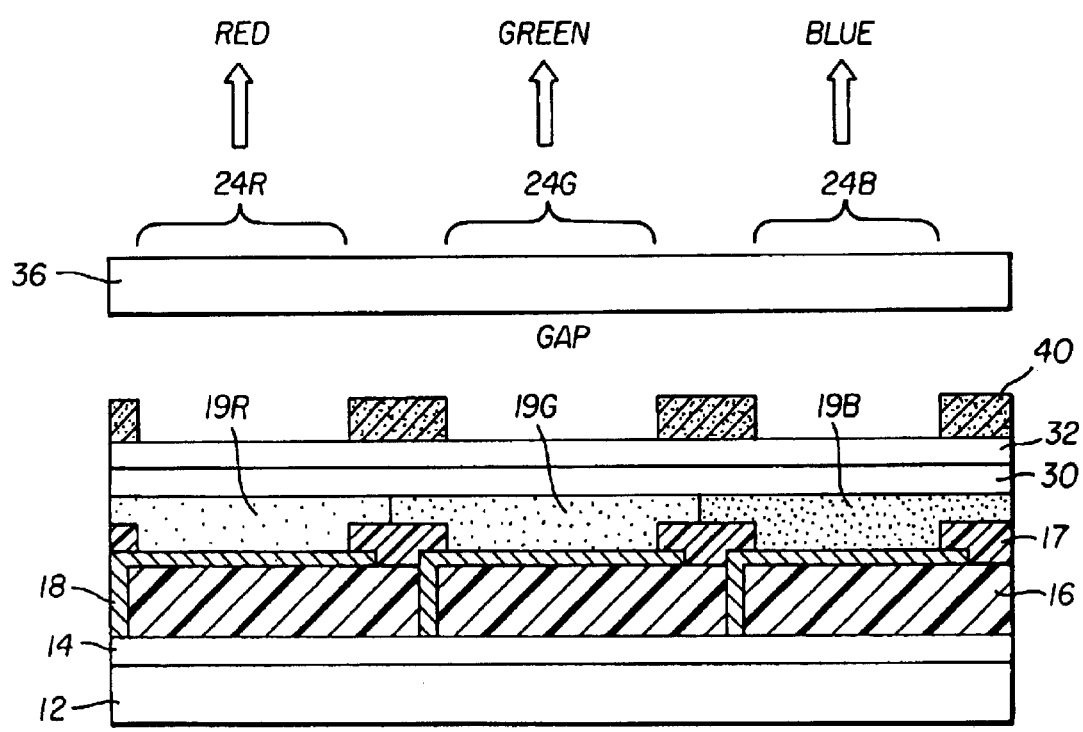
FIG. 2 is a partial cross section of a display having desiccant material applied to the top layer of the OLED substrate according to a first embodiment of the present invention.

Referring to FIG. 2, a first embodiment of the top-emitting OLED device of the present invention includes a transparent protection layer 32 provided over the second electrode, and further provides a patterned layer of light-absorbing desiccant 40 in contact with the transparent protection layer 32. A transparent cover 36 is provided over OLED device with a gap maintained between the device and the cover. Attachment of the cover to the device at the edges of the display is not shown in this partial view.

The transparent protection layer 32 is optional and the patterned layer of desiccant can instead be provided in direct contact with the second electrode 30. When provided, the protection layer 32 may comprise inorganic materials such as SiOx or SiNx, for example, as disclosed in JP 2001126864. Alternatively, the protection layer 32 may comprise organic materials such as polymers, including but not limited to, TEFLON®, polyimides, and polymers disclosed in JP 11-162634. Protection layer 32 may comprise multiple layers of organic or inorganic materials, or combinations thereof. Alternating inorganic and organic layers, for example, as disclosed in U.S. Pat. No. 6,268,295 and WO 00/36665, are useful as protection layer 32. In all cases, the protection layer 32 should have high optical transparency, preferably greater than 70% transmittance. For convenience, the combination of layers from the substrate through the optional protection layer is referred to herein as the OLED substrate.

The light-absorbing desiccant 40 is provided in a patterned arrangement between the light-emitting pixel areas, designated 24R, G, and B of the device such that it does not interfere with the light emitted by the OLED elements 19R, G, and B. As previously mentioned, the light-emitting pixel area is generally defined by the area of the first electrode in contact with the organic EL elements. A top view of the result is shown in FIG. 3.

Figure 3:
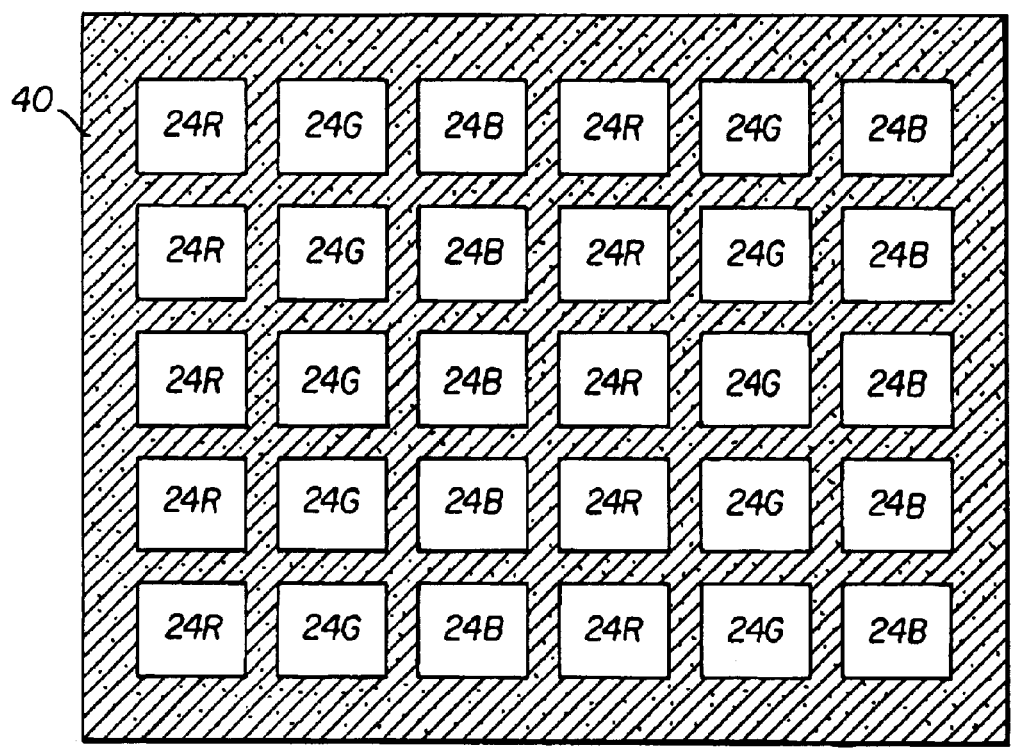
FIG. 3 is a top view of a display shown in FIG. 2.

Referring to FIG. 3, the display device 10 has a patterned array of light-emitting pixel areas 24R, 24G, and 24B that emit red, green, and blue light, respectively. The light-absorbing desiccant material 40 is patterned between the pixels or OLED elements so as to allow light to be emitted from the pixels through the cover (not shown in FIG. 3). The light-absorbing desiccant material need not be deposited over the entire available area, and may be deposited on only a portion of the available device area not used by the light emitting pixel areas. The desiccant material need not be deposited in a planar layer, but can be conformable to the surface of the materials deposited over the substrate. The desiccant material may be deposited and patterned using thick film manufacturing techniques such as screen-printing as are known in the art. The light-absorbing desiccant can be deposited much more thickly and heavily than the OLED layers. In general, the more material that is deposited, the better desiccation and light absorption is provided.

The light-absorbing desiccant material 40 may be deposited in a pattern using photolithographic techniques known in the art. For example, light absorbing desiccant material may be coated as a liquid on the entire surface and exposed to radiation through a mask to polymerize portions of the coating. Portions of the material exposed to the radiation are cured and the remainder is washed away. Dry film photolithography may also be used. In addition, patterned thermal transfer can be used, for example, by coating desiccant material 40 onto a donor substrate, placing the donor substrate in contact or close proximity to the OLED substrate, and selectively heating the donor with a laser to cause transfer of the desiccant material to the OLED substrate. The desiccant material 40 may comprise a plurality of thinner layers deposited by sequential deposition of desiccant materials.

Figure 7:
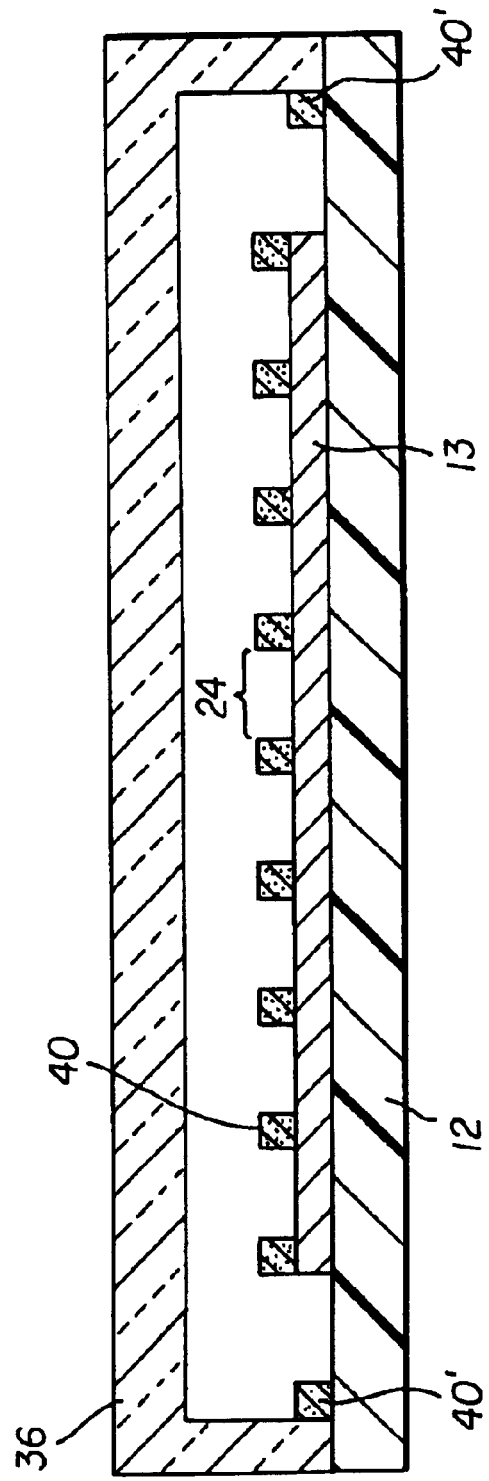
FIG. 7 is a cross section of a display illustrating the desiccant material used around the perimeter of the display device.

As shown in FIG. 7, the cover 36 forms a cavity over the OLED pixel areas 24. The light absorbing desiccant material 40 can be used as a desiccant seal material 40' around the perimeter of the device, further improving desiccation. Sealing is done under inert atmosphere conditions, for example, under nitrogen or argon, so that the gap contains little to no water or oxygen. The light-absorbing desiccant materials may, or may not, actually touch the cover 36. If they do touch, each pixel area becomes an independent cavity. For simplicity, the TFT layers, organic EL layers, second electrode and the optional protection layer are depicted in FIG. 7 as a single combined layer 13.

Many desiccants may be used in this invention, but currently preferred solid desiccants are selected from the group consisting of alkaline metal oxides, alkaline earth metal oxides, sulfates, metal chlorides, and perchlorates. Preferred binders are moisture-permeable and radiation-curable, i.e., they may be cured by exposure to heat or to electromagnetic radiation such as infra-red, visible, or ultra-violet light. Preferred binders include radiation-curable, commercially available photoresist compositions, or radiation-curable acrylates, methacrylates, cyclized polyisoprenes, polyvinyl cinnamates, epoxies, silicones, and adhesives. The desiccant material may include a moisture absorption rate enhancing or maintaining binder selected from the group consisting of cellulose acetates, epoxies, phenoxies, siloxanes, methacrylates, sulfones, phthalates, and amides.

This invention does not require desiccant material 40 or desiccant seal material 40' to have light-absorbing properties, and it may instead be transparent or translucent. Providing desiccant material 40 with light-absorbing properties is useful to increase the contrast of the device. A preferred light-absorbing desiccant material in the present invention has a black color. Patterned light-absorbing desiccant material 40 serves as a black matrix for improving contrast by absorbing ambient light. The terms "black" or "black matrix" are not meant to imply perfect light absorption at all wavelengths, but rather, to imply that the matrix appears dark to an observer and has little hue. The present invention provides advantages over the art in this regard in that contrast is enhanced without the loss of light through the use of circular polarizers or other light-absorbing layers as known in the art. Moreover, light-absorbing desiccant materials will also absorb light emitted or being guided through other layers of the display device. This will have the effect of reducing the level of stray light in the device, improving its sharpness.

While black is preferred, other desiccant colors may be used to yield a desired feature. A light absorber may be an additive to the desiccant/binder matrix and can be selected from the group comprising dyes and pigments. Pigments can include, for example, carbon black, graphite, metal oxides, metal sulfides, and metal complexes such as phthalocyanines. Alternatively, one may select a desiccant or a binder that intrinsically possesses light absorbing properties.

Figure 4:
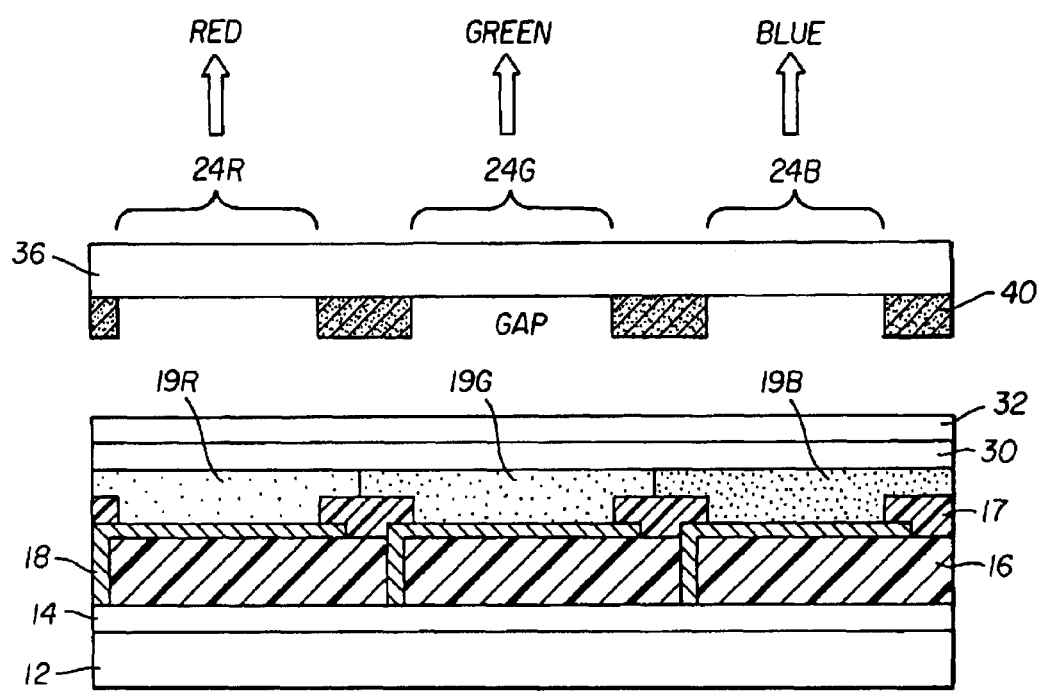
FIG. 4 is a partial cross section of a display with desiccant material applied to the inside of the display device cover according to a second embodiment of the present invention.

In a second embodiment, the light-absorbing desiccant material is applied to the inside of transparent cover 36 rather than the top layer on the OLED substrate. Referring to FIG. 4, the cover may be prepared separately from the OLED substrate. A similar masking technique as described above may be used to deposit patterned desiccant material 40 onto the cover 36. The cover 36 is aligned with the OLED substrate when the cover is affixed to the substrate to ensure that the light-absorbing desiccant does not occlude the light from the pixels.

Alternatively, the light-absorbing desiccant materials are deposited so that the desiccant materials touch both the top layer of the substrate and the cover (not shown). If this is done over all of the display, each pixel element will be enclosed separately within a cavity. It is also possible to deposit light-absorbing desiccant material that touches both the substrate and the cover only on the perimeter (not shown) so that a physical barrier to moisture exists around the periphery of the OLED display device but the pixel elements are all exposed to the gap in common.

Figure 5:
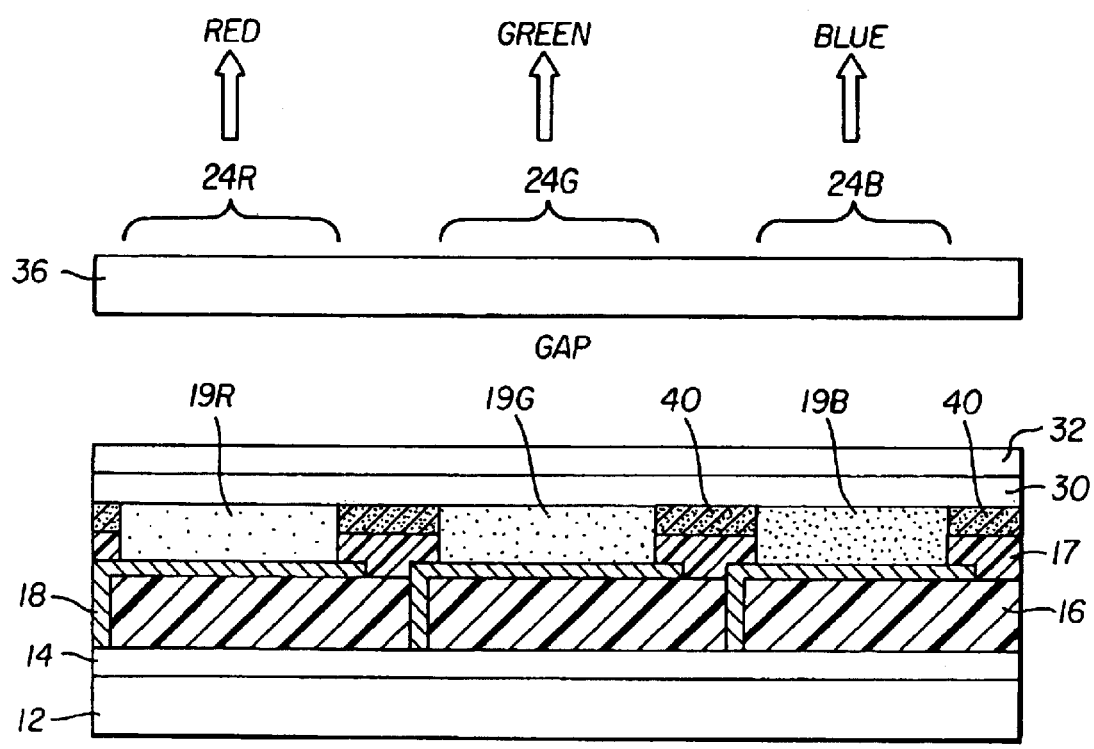
FIG. 5 is a partial cross section of a display with desiccant material used within other layers according to a third embodiment of the present invention.

Referring to FIG. 5, according to a further embodiment, a light-absorbing desiccant 40 is patterned in conjunction with one or more of the layers comprising the organic EL layer such that the patterned desiccant layer is provided between the pixel areas 24. The desiccant material may comprise all or a portion of one or more layers, i.e. it can comprise the layer, or be located within one of the layers. In this case, the process by which the device is made is conventional; the only difference being is that the material that is used to fill the gaps between pixel areas has desiccating properties.

According to another embodiment, second insulating layer 17 comprises an insulating light-absorbing desiccant. Because the second insulating layer defines the pixel areas by defining the exposed area of the first electrode, the patterned desiccant layer is necessarily provided between the pixel areas. The purpose of the second insulating layer 17 is to smooth the edges of the first electrode 18 and to assist in preventing a short circuit to the second electrode 30. The desiccant material can be, for example, one of the desiccants described above, or an acrylic binder mixed with one of the desiccants described above. Any polymer used as the second insulating layer can be used as the binder. The desiccant and binder may be deposited and patterned using conventional photolithography, or any means normally used to deposit and pattern the second insulating layer. Similarly, the first insulating layer 16 may also comprise a desiccant material.

Figure 6:
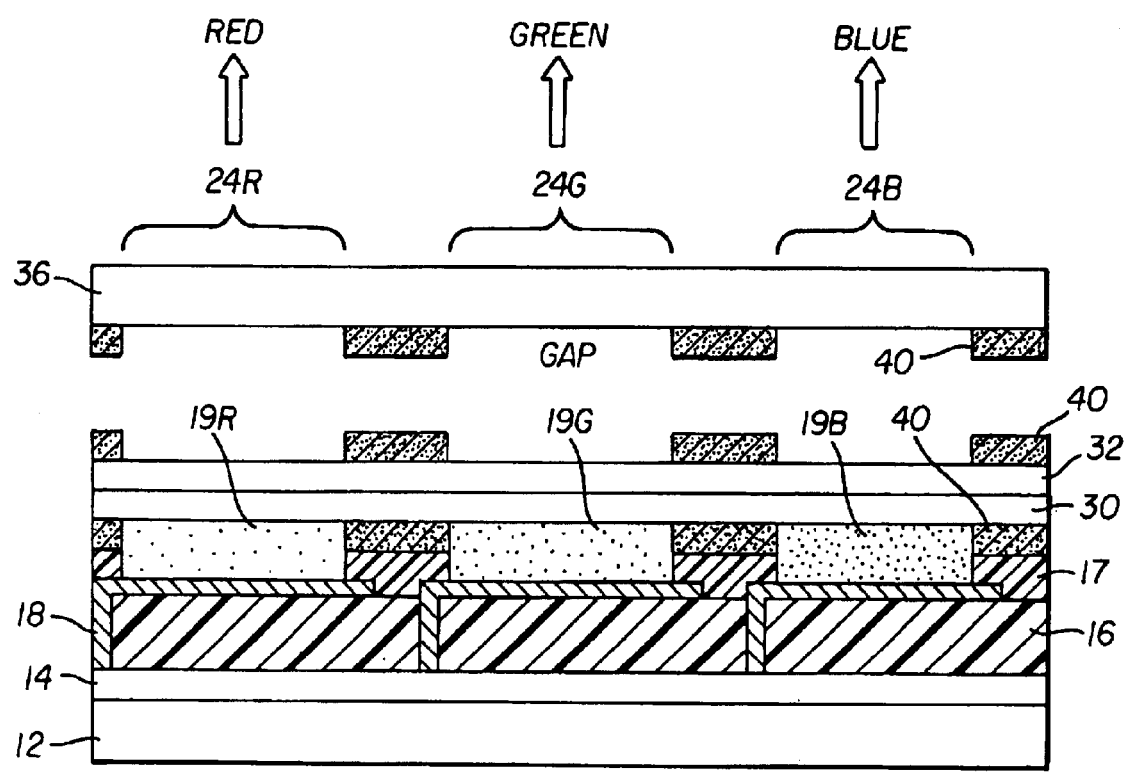
FIG. 6 is a partial cross section of a display with desiccant material on the top layer, on a cover, and within other layers.

As shown in FIG. 6, the various embodiments of the present invention are not mutually exclusive and can be combined in a single device. For example, light-absorbing desiccant material 40 may be patterned on the top layer of the substrate, on the cover, and within other layers. Combining the various embodiments provides further desiccation and contrast enhancement in the display device. A shown in FIG. 6, there are gaps formed between the organic electroluminescent elements 19R, G, B and the desiccant material 40 is provided within the gaps.

Figure 9:
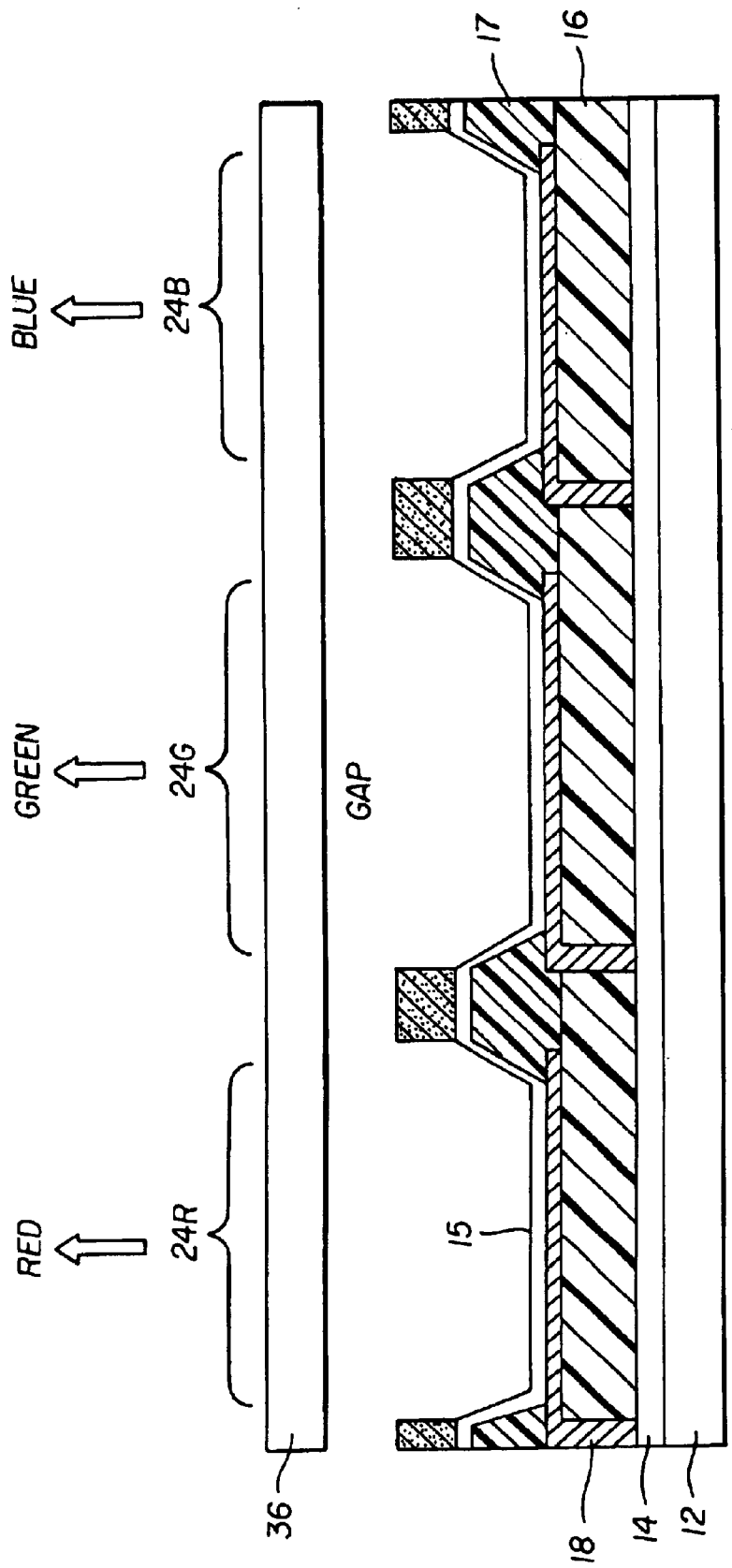
FIG. 9 is a partial cross section of a display where the desiccant material is contact printed.

A second insulating layer is not required in this invention. When it is used, it should be appreciated that it is generally much thicker than the combined thickness of the organic EL elements, second electrode and optional protection layer. When this is the case, a three-dimensional relief pattern is created with the light-emitting pixel areas in recessed regions and the second insulating layers representing the raised areas. This is shown in FIG. 9. The organic EL elements, second electrode, and optional protection layer are shown collectively as combined layer 15 which is deposited in a conformable manner over the structure. When such a relief pattern is present, contact printing of the light-absorbing desiccant 40 can be performed through well-known methods. This is advantageous because it greatly simplifies the desiccant-patterning step.

For example, desiccant 40 may be coated onto a donor sheet, which is placed in physical contact with the OLED substrate. Transfer of the desiccant only takes place at the raised portions because that is where the contact takes place. The OLED substrate surface may be treated with an adhesion promoter to aid transfer. Heat may be used to aid the transfer of the desiccant from the donor to the OLED substrate. Alternatively, the desiccant material 40 may be roller coated onto the raised areas from a roller surface coated with the desiccant.

Figure 8:
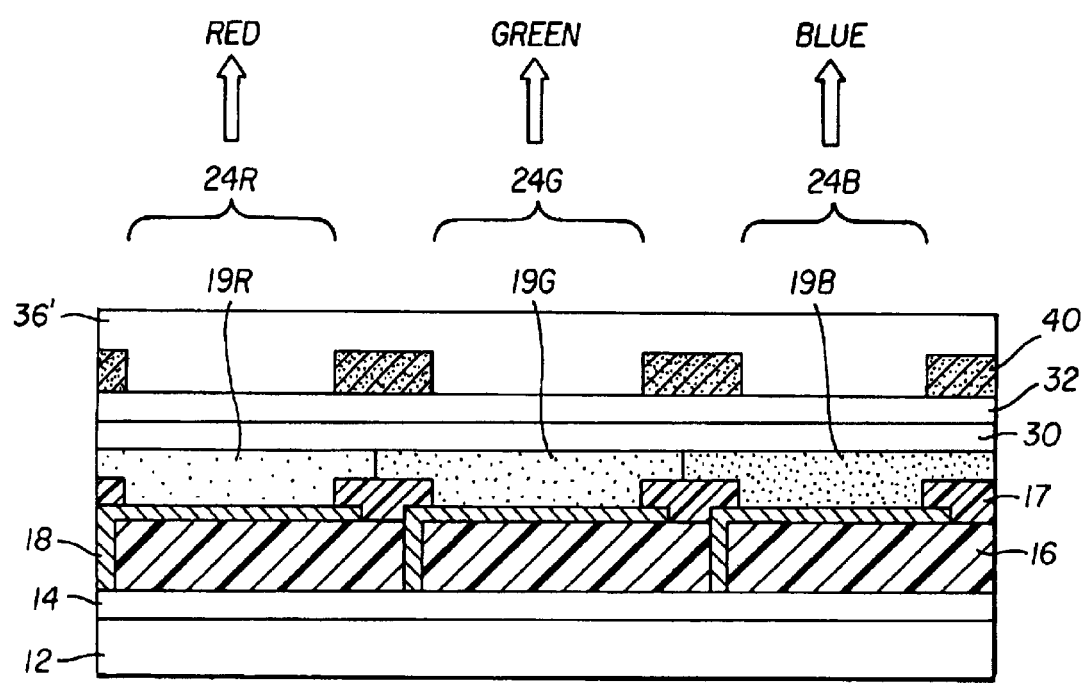
FIG. 8 is a partial cross section of a display with desiccant material applied to the top layer of the OLED substrate and a conformal cover.

While transparent cover 36 is typically glass or plastic sheet, the cover can comprise materials that are deposited in a conformable manner over the surface of the materials deposited over the substrate, i.e., over OLED substrate with patterned desiccant material 40. The same materials useful as protection layer 32 can be used as the transparent conformable cover 36'. This is illustrated in FIG. 8.

This invention is advantageously practiced with top-emitting OLED active matrix devices. However, it is readily apparent to one skilled in the art that this invention may be used in any top-emitting OLED device including simple matrix or passive matrix devices.

OLED Element Architecture

Figure 1A:
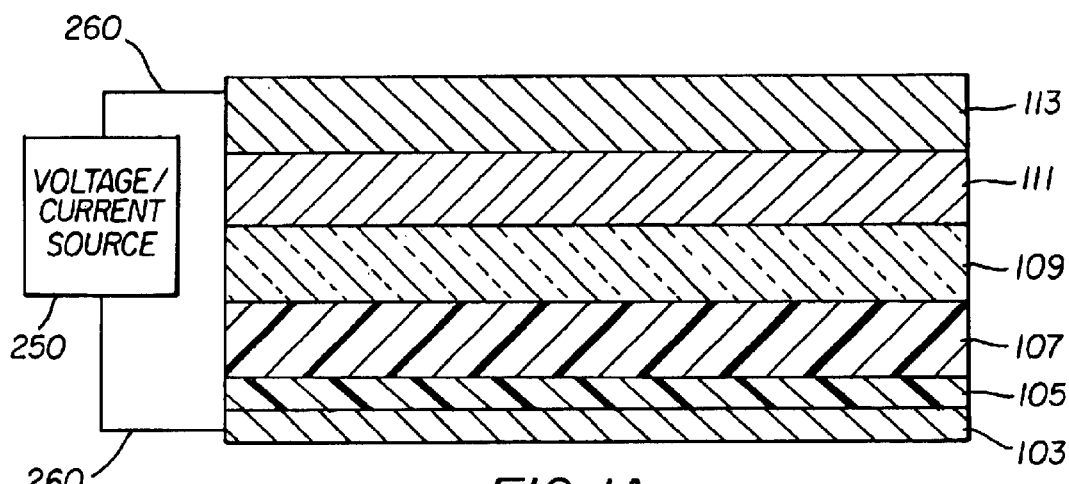
FIG. 1A is a cross section view of a typical OLED element known in the art that illustrates some of the various layers that can be used to construct an OLED element.

There are numerous configurations of the layers within each OLED element wherein the present invention can be successfully practiced. A typical, non-limiting, structure is shown in FIG. 1A and is comprised of an anode layer 103, a hole-injecting layer 105, a hole-transporting layer 107, a light-emitting layer 109, an electron-transporting layer 111, and a cathode layer 113. These layers are described in detail below. The total combined thickness of the organic layers is preferably less than 500 nm. The first electrode 18 may be either the cathode or anode, and the second electrode 30 is necessarily the opposite. A voltage/current source 250 is required to energize the OLED element and conductive wiring 260 is required to make electrical contact to the anode and cathode. The TFT layers and associated wiring serve these functions.

Substrate

Because the OLED elements are not viewed through the substrate, substrate 12 can either be light transmissive or opaque. Substrates for use in this case include, but are not limited to, glass, plastic, semiconductor materials, ceramics, and circuit board materials.

Anode

When the anode layer 103 serves as second electrode 30, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used in layer 103. When anode layer serves the function of the first electrode 18, the transmissive characteristics of layer 103 are immaterial and any conductive material can be used transparent, opaque or reflective. Example conductors for this application include, but are not limited to: gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes.

Hole-Injecting Layer (HIL)

It is often useful that a hole-injecting layer 105 be provided between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to: porphyrinic compounds as described in U.S. Pat. No. 4,720,432, and plasma-deposited fluorocarbon polymers as described in U.S. Pat. No. 6,208,075.

Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520. A more preferred class of aromatic tertiary amines are those which include at least two aromatic tertiary amine moieties as described in U.S. Pat. Nos. 4,720,432 and 5,061,569. Illustrative of useful aromatic tertiary amines include, but are not limited to, the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl] amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Iridium complexes of phenylpyridine and its derivatives are particularly useful luminescent dopants. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline and similar oxine derivatives constitute one class of useful host compounds capable of supporting electroluminescence, and are particularly suitable. Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc (II)
CO-4: Bis(2-methyl-8-quinolinolato)aluminum(III)-$\mu$-oxo-bis(2-methyl-8-quinolinolato) aluminum(III)
CO-5: Indium trisoxine [alias, tris(8-quinolinolato) indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to: derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

The cathode 113 serves as the first electrode 18, it need not be transparent and can comprise nearly any conductive material. Desirable cathode materials have good film-forming properties to ensure good contact with the underlying organic layer, promote electron injection at low voltage, and have good stability. Useful cathode materials often contain a low work function metal (<4 0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) and a thicker layer of conductive metal. The EIL is situated between the cathode and the organic layer (e.g., ETL). Here, the EIL preferably includes a low work function metal or metal salt, and if so, the thicker conductor layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When cathode layer 113 serves as the second electrode 30, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357). While all organic layers may be patterned, it is most common that only the layer emitting light is patterned, and the other layers may be uniformly deposited over the entire device.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover. In another embodiment of this invention, the OLED elements may emit white light and a RGB filter array is provided over the white-emitting OLED elements to provide a full color display device.

The invention has been described in detail with particular reference to certain preferred embodiments thereof, but it will be understood that variations and modifications can be effected within the spirit and scope of the invention.

Parts List 10 top-emitting OLED device
12 substrate
13 combined layer
14 TFT active matrix layer
15 combined layer
16 first insulating layer
17 second insulating layer
18 first electrode
19B blue-emitting organic EL element
19G green-emitting organic EL element
19R red-emitting organic EL element
24 pixel area
24B blue-emitting pixel area
24G green-emitting pixel area
24R red-emitting pixel area
30 transparent second electrode
32 protection layer 36 transparent cover
36' transparent conformable cover
40 desiccant material
40' desiccant seal material
103 anode layer
105 hole-injecting layer
107 hole-transporting layer
109 light-emitting layer
111 electron-transporting layer
113 cathode layer
250 voltage/current source
260 conductive wiring

What is claimed is:

1. A method of manufacturing a top-emitting OLED display device, comprising the steps of:
   a) providing a substrate;
   b) forming an array of OLED elements on one side of the substrate, wherein the light-emitting area of each OLED element defines the light-emitting pixel area; and
   c) forming a patterned arrangement of desiccant material on the same side of the substrate and arranged between the light-emitting pixel areas such that the desiccant material does not interfere with the light emitted by the OLED elements, the patterned arrangement of desiccant material being black and serving as a black matrix for improving contrast by absorbing ambient light.

2. The method claimed in claim 1, wherein photolithographic processes are used to deposit the patterned arrangement of desiccant material.

3. The method claimed in claim 1, wherein the desiccant material is applied to the substrate as a liquid and is cured to form a solid.

4. The method claimed in claim 1, wherein thick film screen printing processes are used to deposit the patterned arrangement of desiccant material.

5. The method claimed in claim 1, wherein the desiccant material is applied to raised portions of the OLED device by contact printing.

6. The method claimed in claim 1, wherein the desiccant material is applied using a thermal transfer process from a donor substrate.

* * * * *